United States Patent
Fedorov et al.

(10) Patent No.: US 8,531,029 B2
(45) Date of Patent: Sep. 10, 2013

(54) ELECTRON BEAM INDUCED DEPOSITION OF INTERFACE TO CARBON NANOTUBE

(75) Inventors: Andrei G. Fedorov, Atlanta, GA (US); Konrad Rykaczewski, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/476,510

(22) Filed: May 21, 2012

(65) Prior Publication Data

US 2012/0228758 A1   Sep. 13, 2012

Related U.S. Application Data

(62) Division of application No. 12/493,278, filed on Jun. 29, 2009, now Pat. No. 8,207,058.

(51) Int. Cl.
*B82Y 40/00* (2011.01)
*H01L 23/48* (2006.01)

(52) U.S. Cl.
USPC ...... 257/734; 977/752; 977/847; 118/723 FE; 257/E23.01

(58) Field of Classification Search
USPC ...... 257/734, E23.01; 118/723 FE; 977/752, 977/847
See application file for complete search history.

(56) References Cited

U.S. PATENT DOCUMENTS

| 7,094,679 | B1 | 8/2006 | Li et al. | |
| 7,803,712 | B2 | 9/2010 | Kornilovich et al. | |
| 2008/0038894 | A1* | 2/2008 | Rueger et al. | 438/308 |
| 2008/0236804 | A1 | 10/2008 | Cola et al. | |

OTHER PUBLICATIONS

"International Technology Roadmap for Semiconductors," Emerging Research Devices, 2007, 55 pages.
Dong, Lifeng et al., "Effects of local Joule heating on the reduction of contact resistance between carbon nanotubes and metal electrodes," Journal of Applied Physics, vol. 101, Issue 2, published online Jan. 24, 2007, p. 024320-1, 7 pages.
Anantram, M.P., et al., "Physics of carbon nanotube electronic devices," Reports on Progress in Physics, vol. 69, No. 3, Mar. 2006, pp. 507-561.
Graham, A.P., et al., "How do carbon nanotubes fit into the semiconductor roadmap?" Applied Physics A, vol. 80, No. 6, Mar. 11, 2005, pp. 1141-1151.
Collins, Philip G., et al., "Current Saturation and Electrical Breakdown in Multiwalled Carbon Nanotubes," Physical Review Letters, vol. 86, No. 14, Apr. 2, 2001, pp. 3128-3131.

(Continued)

*Primary Examiner* — Alexander Ghyka
*Assistant Examiner* — Stanetta Isaac
(74) *Attorney, Agent, or Firm* — Withrow & Terranova, P.L.L.C.

(57) ABSTRACT

A system and method are provided for fabricating a low electric resistance ohmic contact, or interface, between a Carbon Nanotube (CNT) and a desired node on a substrate. In one embodiment, the CNT is a Multiwalled, or Multiwall, Carbon Nanotube (MWCNT), and the interface provides a low electric resistance ohmic contact between all conduction shells, or at least a majority of conduction shells, of the MWCNT and the desired node on the substrate. In one embodiment, a Focused Electron Beam Chemical Vapor Deposition (FEB-CVD) process is used to deposit an interface material near an exposed end of the MWCNT in such a manner that surface diffusion of precursor molecules used in the FEB-CVD process induces lateral spread of the deposited interface material into the exposed end of the MWCNT, thereby providing a contact to all conduction shells, or at least a majority of the conduction shells, of the MWCNT.

16 Claims, 5 Drawing Sheets

(56) References Cited

OTHER PUBLICATIONS

Li, Hong et al., "Circuit Modeling and Performance Analysis of Multi-Walled Carbon Nanotube Interconnects," IEEE Transactions on Electron Devices, vol. 55, No. 6, Jun. 2008, pp. 1328-1337.
Tersoff, J., "Contact resistance of carbon nanotubes," Applied Physics Letters, vol. 74, No. 15, Apr. 12, 1999, pp. 2122-2124.
Frank, S., et al., "Carbon nanotube quantum resistors," Science, 1998, 280(5370), p. 1744-1746.
Nihei, Mizuhisa et al., "Low-resistance Multi-walled Carbon Nanotube Vias with Parallel Channel Conduction of Inner Shells," Proceedings of the IEEE 2005 International Interconnect Technology Conference, Jun. 6-8, 2005, pp. 234-236.
Sato, Shintaro et al., "Novel approach to fabricating carbon nanotube via interconnects using size-controlled catalyst nanoparticles," 2006 International Interconnect Technology Conference, Jun. 5-7, 2006, pp. 230-232.
Li, H.J., et al., "Multichannel Ballistic Transport in Multiwall Carbon Nanotubes," Physical Review Letters, vol. 95, No. 8, Aug. 15, 2005, p. 086601-1, 4 pages.
Langford, R.M., et al., "Comparison of different methods to contact to nanowires," Journal of Vacuum Science and Technology, vol. 24, Issue 5, Sep./Oct. 2006, pp. 2306-2311.
Dockendorf, Cedric P. R., et al., "Individual carbon nanotube soldering with gold nanoink deposition," Applied Physics Letters, vol. 90, Issue 19, published online May 9, 2007, p. 193116-1, 3 pages.
Bachtold, A., et al., "Contacting carbon nanotubes selectively with low-ohmic contacts for four-probe electric measurements," Applied Physics Letters, vol. 73, No. 2, Jul. 13, 1998, pp. 274-276.
Rice, Paul, "Broadband Electrical Characterization of Multiwalled Carbon Nanotubes and Contacts," Nano Letters, vol. 7, No. 4, published online Mar. 22, 2007, pp. 1086-1090.
Bussolotti, F., et al., "In situ manipulation and electrical characterization of multiwalled carbon nanotubes by using nanomanipulators under scanning electron microscopy," Physical Review B, 2007 76(12).
Federov, Andrei G., et al., "Transport issues in focused electron beam chemical vapor deposition," Surface & Coatings Technology, vol. 201, Issues 22-23, Sep. 25, 2007, pp. 8808-8812.
Ando, Atsushi et al., "Improvement of electrical contact at carbon nanotube/Pt by selective electron irradiation," Physica E, vol. 24, Issues 1-2, Aug. 2004, pp. 6-9.
Madsen, Dorte Nørgaard et al., "Soldering of Nanotubes onto Microelectrodes," Nano Letters, vol. 3, No. 1, Jan. 2003, pp. 47-49.
Mølhave, Kristian et al., "Constructing, connecting and soldering nanostructures by environmental electron beam deposition," Nanostructures, vol. 15, Jun. 21, 2004, pp. 1047-1053.
Mølhave, Kristian et al., "Solid Gold Nanostructures Fabricated by Electron Beam Deposition," Nano Letters, vol. 3, No. 11, published online Oct. 1, 2003, pp. 1499-1503.
Song, J.W., et al., "Characterization and air pressure sensing of doubly clamped multi-walled carbon nanotubes," Nanotechnology, 2008, 19(1) p. 4.
Subramanian, A., et al., "Batch fabrication of carbon nanotube bearings," Nanotechnology, vol. 18, Jan. 12, 2007, 9 pages.
Naeemi, Azad et al., "Performance Comparison Between Carbon Nanotube and Copper Interconnects for Gigascale Integration (GSI)," IEEE Electron Device Letters, vol. 26, No. 2, Feb. 2005, pp. 84-86.
Close, Gael F., et al., "A 1 GHz Integrated Circuit with Carbon Nanotube Interconnects and Silicon Transistors," Nano Letters, vol. 8, No. 2, published online Feb. 13, 2008, pp. 706-709.
Ding, W., et al., "Mechanics of hydrogenated amorphous carbon deposits from electron-beam-induced deposition of a paraffin precursor," Journal of Applied Physics, vol. 98, Issue 1, published online Jul. 7, 2005, p. 014905-1, 7 pages.
Utke, Ivo et al., "Gas-assisted focused electron beam and ion beam processing and fabrication," Journal of Vacuum Science and Technology B, vol. 26, Issue 4, Jul./Aug. 2008, pp. 1197-1276.
Kahng, Yung Ho et al., "The role of an amorphous carbon layer on a multi-wall carbon nanotube attached atomic force microscope tip in making good electrical contact to a gold electrode," Nanotechnology, vol. 19, Apr. 8, 2008, 7 pages.
Kiang, Ching-Hwa, "Electron irradiation induced dimensional change in bismuth filled carbon nanotubes," Carbon, vol. 38, Issues 1-2, published online Aug. 14, 2000, pp. 1699-1701.
Yu, Min-Feng et al., "Tensile Loading of Ropes of Single Wall Carbon Nanotubes and their Mechanical Properties," Physical Review Letters, vol. 84, No. 24, Jun. 12, 2000, pp. 5552-5555.
Yu, Min-Feng et al., "Three-dimensional manipulation of carbon nanotubes under a scanning electron microscope," Nanotechnology, vol. 10, No. 3, Sep. 1999, pp. 244-252.
Dong, Lixin et al., "Electron-beam-induced deposition with carbon nanotube emitters," Applied Physics Letters, vol. 81, No. 10, Sep. 2, 2002, pp. 1919-1921.
Fukuda, Toshio et al., "Fabrication and Property Analysis of MWNT Junctions through Nanorobotic Manipulations," International Journal of Nonlinear Sciences and Numerical Simulation, vol. 3, Issue 3-4, Dec. 2002, pp. 753-758.
Fukuda, Toshio et al., "Assembly of Nanodevices With Carbon Nanotubes Through Nanorobotic Manipulations," Proceedings of the IEEE, vol. 91, No. 11, Nov. 2003, pp. 1803-1818.
Nakayama, Yoshikazu, "Scanning probe microscopy installed with nanotube probes and nanotube tweezers," Ultramicroscopy, vol. 91, Issues 1-4, May 2002, pp. 49-56.
Abe, Hidekazu et al., "Electric transport and mechanical strength measurements of carbon nanotubes in scanning electron microscope," Physica E, vol. 24, Issues 1-2, Aug. 2004, pp. 42-45.
Wang, Mingsheng et al., "Fabrication and Electrical and Mechanical Properties of Carbon Nanotube Interconnections," Advanced Functional Materials, vol. 15, Issue 11, Nov. 2005, pp. 1825-1831.
Chen, Qing et al., "Establishing Ohmic contacts for in situ current-voltage characteristic measurements on a carbon nanotube inside the scanning electron microscope," Nanotechnology, vol. 17, No. 4, Jan. 30, 2006, pp. 1087-1098.
Yang, Quanhong, "Local reconstruction and controllable nanospot welding of multiwalled carbon nanotubes under mild electron beam irradiation," Materials Letters, vol. 60, published online Feb. 14, 2006, pp. 2433-2437.
Dong, L.X., et al., "Carbon nanotubes for nanorobotics," Nano Today, 2007, 2(6), pp. 12-21.
Kaplan-Ashiri, Ifat et al., "Microscopic Investigation of Shear in Multiwalled Nanotube Deformation," Journal of Physical Chemistry C, vol. 111, published online May 27, 2007, pp. 8432-8436.
Wei, Dacheng et al., "Real Time and in Situ Control of the Gap Size of Nanoelectrodes for Molecular Devices," Nano Letters, vol. 8, No. 6, published online May 23, 2008, pp. 1625-1630.
Silvis-Cividjian, Natalia, "Electron Beam Induced Nanometer Scale Deposition," Doctoral Thesis, Delft University of Technology, The Netherlands, Apr. 22, 2002, 288 pages.
Rykaczewski, Konrad et al., "Dynamic growth of carbon nanopillars and microrings in electron beam induced dissociation of residual hydrocarbons," Ultramicroscopy, vol. 108, Issue 9, Aug. 2008, pp. 989-992.
Ueda, K., et al., Fabrication of nanofigures by focused electron beam-induced deposition, Thin Solid Films, 2004 (464-465), pp. 331-334.
Rykaczewski, Konrad et al., "Analysis of electron beam induced deposition (EBID) of residual hydrocarbons in electron microscopy," Journal of Applied Physics, vol. 101, No. 5, published online Mar. 6, 2007, p. 054307-1, 12 pages.
Yoshikawa, Yuya et al., "Barrier Modification at Contacts between Carbon Nanotube and Pt Electrode Using Well-Controlled Joule Heating," Japanese Journal of Applied Physics, vol. 46, No. 15, published online Apr. 6, 2007, pp. L359-L361.
Banhart, Florian, "The Formation of a Connection between Carbon Nanotubes in an Electron Beam," Nano Letters, vol. 1, No. 6, published online Jun. 13, 2001, pp. 329-332.
Miyato, Y., et al., "Local surface potential measurements of carbon nanotube FETs by Kelvin probe force microscopy," Japanese Journal of Applied Physics Part 1—Regular Papers, Short Notes and Review Papers, 2005, 44 (4A), pp. 1633-1636.
Dong, Lifeng et al., "Floating-Potential Dielectrophoresis-Controlled Fabrication of Single-Carbon-Nanotube Transistors and Their Electrical Properties," Journal of Physical Chemistry B, vol. 109, No. 27, published online Jun. 17, 2005, pp. 13148-13153.
cheaptubes.com, "Mulit Walled Carbon Nanotubes," Accessed Dec. 23, 2011, www.cheaptubesinc.com, 2 pages.
Catalytic Materials LLC, "Product Catalog," Accessed Dec. 23, 2011, www.catalyticmaterials.com, 1 page.
Nanostructured & Amorphous Materials, Inc., "MWNT (95+%, OD 60-100nm)," Accessed Dec. 23, 2011, www.nanoamor.com, 1 page.
Sesres, "Nanotubes," Accessed Dec. 23, 2011, www.sesres.com, 3 pages.
Nano Lab, "Nanotubes," Accessed Dec. 23, 2011, www.nano-lab.com, 2 pages.
Helix, "Products—Carbon Nanotubes," Accessed Dec. 23, 2011, www.helixmaterial.com, 3 pages.
Qian, Weizhong et al., "Quantitative Raman characterization of the mixed samples of the single and multi-wall carbon nanotubes," Carbon, vol. 41, Issue 9, published online Jun. 14, 2003, pp. 1851-1864.
Costa, S. et al., "Characterization of carbon nanotubes by Raman spectroscopy," Materials Science-Poland, vol. 26 No. 2, 2008, pp. 433-441.
Ajayan, P.M. et al., "Capillariry induced filling of carbon nanotubes," Nature, vol. 361 No. 6410, 1993, pp. 333-334.
Lan, Chun et al., "Determining the optimal contact length for a metal/multiwall carbon nanotube interconnect," Applied Physics Letters, vol. 92, Issue 21, published online May 29, 2008, p. 213112-1, 3 pages.
Subramanian, A. et al., "Local control of electric current driven shell etching of multiwalled carbon nanotubes," Applied Physics A—Materials Science & Processing, vol. 89 No. 1, 2007, pp. 133-139.
Ajayan, P.M., et al., "Opening carbon nanotubes with oxygen and implications for filling," Nature, vol. 362, Apr. 8, 1993, pp. 522-525.
Tsang, S.C., et al., "A simple chemical method of opening and filling carbon nanotubes," Nature, vol. 372, Nov. 10, 1994, pp. 159-162.
Ito, Takashi et al., "Electrochemical Etching of Individual Multiwall Carbon Nanotubes," Electrochemical and Solid-State Letters, vol. 6, Issue 1, published online Nov. 13, 2002, pp. C4-C7.
Banhart, Florian, "Irradiation effects in carbon nanostructures," Reports on Progress in Physics, vol. 62, No. 8, Aug. 1999, pp. 1181-1221.
Yuzvinsky, T.D., et al., "Precision cutting of nanotubes with a low-energy electron beam," Applied Physics Letters, vol. 86, Issue 5, published online Jan. 25, 2005, p. 053109-1, 3 pages.
Mølhave, Kristian et al., "Electron irradiation-induced destruction of carbon nanotubes in electron microscopes," Ultramicroscopy, vol. 108, Issue 1, Dec. 2007, pp. 52-57.
Choi, Young R., et al., "Effect of Electron Beam-Induced Deposition and Etching Under Bias," Scanning, vol. 29, Issue 4, Jul./Aug. 2007, published online Jun. 27, 2007, pp. 171-176.
Wei, X. L. et al., "Controlling electron beam induced carbon deposition on carbon nanotubes by Joule heating," Nanotechnology, vol. 19 No. 35, 2008, pp. 5.
Jiang, Chaoyang et al., "Strain-Sensitive Raman Modes of Carbon Nanotubes in Deflecting Freely Suspended Nanomembranes," Advanced Materials, vol. 17, Issue 17, Sep. 2005, published online Aug. 29, 2005, pp. 2127-2131.
Ko, Hyunhyub et al., "High-resolution Raman microscopy of curled carbon nanotubes," Applied Physics Letters, vol. 85, No. 13, Sep. 27, 2004, pp. 2598-2600.
Rispal, Lorraine et al., "Carbon Nanotube Transistor Fabrication Assisted by Topographical and Conductive Atomic Force Microscopy," Japanese Journal of Applied Physics, vol. 45, No. 4B, published online Apr. 25, 2006, pp. 3672-3679.
Porti M., et al., "Reliability of SiO2 and high-k gate insulators: a nanoscale study with conductive atomic force microscopy," Microelectronic Engineering, vol. 84, Issue 3, Mar. 2007, published online Nov. 7, 2006, pp. 501-505.
Diesinger, H., et al., "Electric force microscopy of individually charged semiconductor nanoparticles," Physica Status Solidi A, vol. 203, No. 6, published online May 3, 2006, pp. 1344-1347.
Lei, C.H., et al., "Conductivity of macromolecular networks measured by electrostatic force microscopy," Applied Physics Letters, vol. 83, No. 3, Jul. 21, 2003, pp. 482-484.
Nonnenmacher, M., et al., "Kelvin probe force microscopy," Applied Physics Letters, vol. 58, No. 25, Jun. 24, 1991, pp. 2921-2923.
Miyato, Yuji et al., "Surface potential investigation on single wall carbon nanotubes by Kelvin probe force microscopy and atomic force microscope potentiometry," Nanotechnology, vol. 18, No. 8, Feb. 28, 2007, published online Jan. 18, 2007, 5 pages.
Okigawa, Y. et al., "Potential profile measurement of carbon nanotube FETs based on the electrostatic force detection," Nano, vol. 3 No. 1, 2008, pp. 51-54.
Zdrojek, M., et al., "Inner-shell charging of multiwalled carbon nanotubes," Physical Review B, vol. 77, Issue 3, published Jan. 7, 2008, p. 033404-1, 4 pages.
Pettinger, Bruno et al., "Surface-enhanced and STM-tip-enhanced Raman Spectroscopy at Metal Surfaces," Single Molecules, vol. 3, Issue 5-6, Nov. 6, 2002, pp. 285-294.
Nie, Shuming et al., "Probing Single Molecules and Single Nanoparticles by Surface-Enhanced Raman Scattering," Science, vol. 275, Feb. 21, 1997, pp. 1102-1106.
Messina, G., et al., "Multi-wavelength Raman investigation of sputtered a-C film nanostructure," Surface & Coatings Technology, vol. 200, Issues 18-19, May 8, 2006, pp. 5427-5434.
Zhang, L., et al., "Effect of annealing on structure and haemocompatibility of tetrahedral amorphous hydrogenated carbon films," Materials Letters, vol. 62, Issues 6-7, Mar. 15, 2008, pp. 1040-1043.
Ogwu, A.A., et al., "Characterisation of thermally annealed diamond like carbon (DLC) and silicon modified DLC films by Raman spectroscopy," Physica B, vol. 269, Issues 3-4, Sep. 1999, pp. 335-344.
Tuinstra, F., et al., "Raman Spectrum of Graphite," The Journal of Chemical Physics, vol. 53, No. 3, Aug. 1, 1970, pp. 1126-1130.
Utke, Ivo et al., "Cross Section Investigations of Compositions and Sub-Structures of Tips Obtained by Focused Electron Beam Induced Deposition," Advanced Engineering Materials, vol. 7, No. 5, May 2005, pp. 323-331.
Banhart, F., "Irradiation of carbon nanotubes with a focused electron beam in the electron microscope," Journal of Material Science, vol. 41, No. 14, Jul. 1, 2006, pp. 4505-4511.
Krasheninnikov, A.V., et al., "Engineering of nanostructured carbon materials with electron or ion beams," Nature Materials, vol. 6, Oct. 2007, pp. 723-733.
Leger, J., et al., "Monte Carlo simulation of electron beam transport in graphite for composite application from MeV down to eV," Journal of Physics D: Applied Physics, vol. 38, No. 7, Apr. 7, 2005, pp. 1005-1015.
Schwartz, Peter et al., "Numerical computation of diffusion on a surface," Proceedings of the National Academy of Sciences (PNAS), vol. 102, No. 32, Aug. 9, 2005, pp. 11151-11156.

* cited by examiner

ELECTRON BEAM INDUCED DEPOSITION OF INTERFACE TO CARBON NANOTUBE

This application is a divisional of U.S. patent application Ser. No. 12/493,278, filed Jun. 29, 2009, now U.S. Pat. No. 8,207,058, the disclosure of which is incorporated herein by reference in its entirety.

This invention was made with government funds under contract number 0403671 awarded by the National Science Foundation. The U.S. Government has certain rights in this invention.

FIELD OF THE DISCLOSURE

This disclosure relates to fabrication of an interface between a Carbon Nanotube (CNT) and a desired node on a substrate.

BACKGROUND

Low-resistance, stable contacts are critical for the performance and reliability of integrated circuits. As such, the preparation and characterization of contacts for integrated circuits demand major efforts in circuit fabrication. Conventional techniques for fabricating contacts are fundamentally flawed in making low resistance contacts between Multi-walled Carbon Nanotubes (MWCNTs) or MWCNT-based devices and metal pads or wires. Specifically, conventional techniques lack the level of control on nanoscale required for making a precise connection to MWCNTs and, most importantly, can only be used to establish electric contact to the outer conduction shell of the MWCNT. As such, a majority of the conduction channels through the inner shells of the MWCNT cannot be utilized, thus negating a key advantage of MWCNTs as highly efficient multi-channel electric conductors.

SUMMARY

The present disclosure describes a system and method for fabricating a low electric resistance ohmic contact, or interface, between a Carbon Nanotube (CNT) and a desired node on a substrate. In one embodiment, the CNT is a Multiwalled, or Multiwall, Carbon Nanotube (MWCNT), and the interface provides a low electric resistance ohmic contact between all conduction shells, or at least a majority of conduction shells, of the MWCNT and the desired node on the substrate. In one embodiment, a Focused Electron Beam Chemical Vapor Deposition (FEB-CVD) process, which is also referred to as Electron Beam Induced Deposition (EBID) process, is used to deposit an interface material near an exposed end of the MWCNT in such a manner that surface diffusion of precursor molecules used in the FEB-CVD process induces lateral spread of the deposited interface material into the exposed end of the MWCNT. As a result of the lateral spread of the deposited interface material into the exposed end of the MWCNT, the interface material provides a contact to all conduction shells, or at least a majority of the conduction shells, of the MWCNT. The deposited interface material provides a low electric resistance ohmic contact between the MWCNT and the desired node on the substrate.

More specifically, in one embodiment, a MWCNT is first aligned between two electrically conducting interconnects on a substrate. Each of the electrically conducting interconnects may be, for example, a metallic interconnect, an electrically conducting polymer interconnect, a graphene interconnect, or the like. The substrate may be, for example, a semiconductor substrate, a dielectric substrate, or the like. If the ends of the MWCNT do not expose inner shells of the MWCNT, the ends of the MWCNT are cut to expose the inner shells of the MWCNT using a technique such as, for example, Focused Ion Beam (FIB) milling. Next, for each of the exposed ends of the MWCNT, a FEB-CVD process is performed wherein a primary electron beam is focused near the exposed end of the MWCNT. As a result, an interface material is deposited near the exposed end of the MWCNT such that, during deposition, the interface material laterally spreads into the exposed end of the MWCNT and makes contact to all of the conduction shells, or at least a majority of the conduction shells, of the MWCNT. Further, in one embodiment, a timing of an on/off regime of the primary electron beam is controlled such that surface diffusion of precursor molecules used in the FEB-CVD process has sufficient time to induce lateral spread of the deposited interface material into the exposed end of the MWCNT. A shape and size of the deposited interface material may be controlled via parameters of the FEB-CVD process. The shape of the deposited interface as well as the size of the contact area of the interface material to both the MWCNT and the electrically conducting interconnect define the interface thermal resistance between the MWCNT and the electrically conducting interconnect.

In another embodiment, one end of the MWCNT is aligned with an end of a second MWCNT. If the aligned ends of the MWCNTs do not expose inner shells of the MWCNTs, the aligned ends of the MWCNTs are cut to expose the inner shells of the MWCNTs using a technique such as, for example, FIB milling. Next, a FEB-CVD process is performed wherein a primary electron beam is focused near the aligned exposed ends of the MWCNTs. As a result, an interface material is deposited near the aligned exposed ends of the MWCNTs such that, during deposition, the interface material laterally spreads into the aligned exposed ends of the MWCNTs and makes contact to all of the conduction shells, or at least a majority of the conduction shells, of the MWCNTs. Further, in one embodiment, a timing of an ON/OFF regime of the primary electron beam is controlled such that surface diffusion of precursor molecules used in the FEB-CVD process has sufficient time to induce lateral spread of the deposited interface material into the aligned exposed ends of the MWCNTs. A shape and size of the deposited interface material may be controlled via parameters of the FEB-CVD process. The shape of the deposited interface as well as the size of the contact area of the interface material to the MWCNTs define the interface thermal resistance between the MWCNTs.

In one embodiment, the deposited interface material is amorphous carbon (a-C), and post-processing is used to lower an electric resistance of the deposited interface material while maintaining contact between the metal pad/wire and the MWCNT. More specifically, an annealing process induced by either direct heating (thermal) or by passing an electric current through the interface (electric) may be performed to provide total or partial graphitization of the deposited carbon interface material, thereby substantially reducing the electric resistance of the deposited carbon interface material. In another embodiment, the deposited interface material is a metallic material and the precursor molecule is an organometallic compound.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention.

DETAILED DESCRIPTION

The embodiments set forth below represent the necessary information to enable those skilled in the art to practice the invention and illustrate the best mode of practicing the invention. Upon reading the following description in light of the accompanying drawings, those skilled in the art will understand the concepts of the invention and will recognize applications of these concepts not particularly addressed herein. It should be understood that these concepts and applications fall within the scope of the disclosure and the accompanying claims.

Figure 1A:
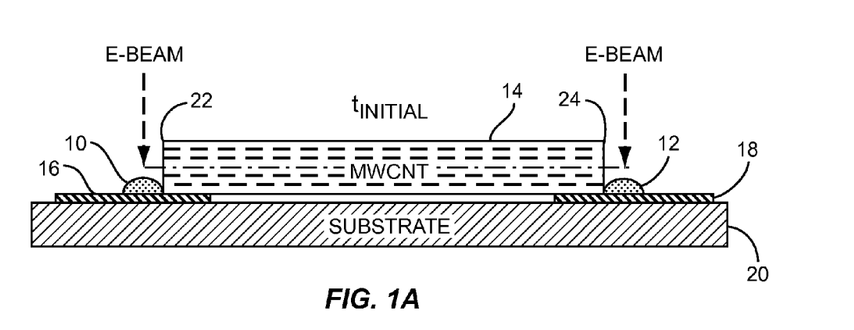
FIGS. 1A-1C graphically illustrate fabrication of interfaces between a Multiwalled Carbon Nanotube (MWCNT) and electrically conducting interconnects on a substrate according to one embodiment of the present disclosure.
Figure 1B:
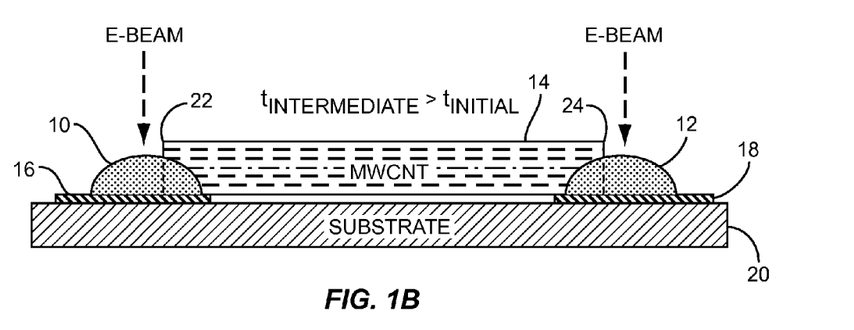
Figure 1C:
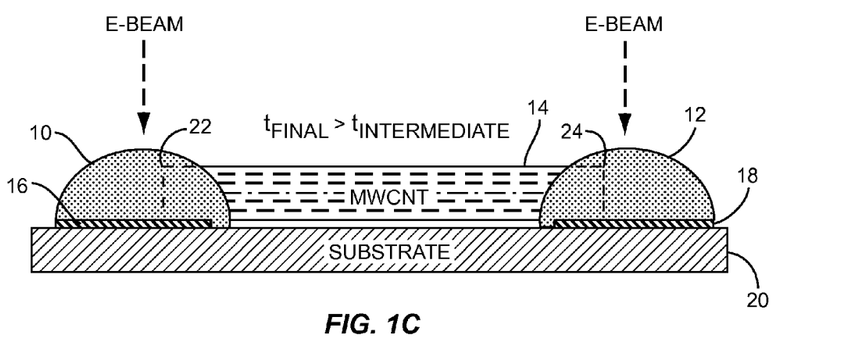

FIGS. 1A through 1C graphically illustrate a process for fabricating interfaces 10 and 12 between a Carbon Nanotube (CNT) 14 and electrically conducting interconnects 16 and 18 (hereinafter interconnects 16 and 18) on a substrate 20 according to one embodiment of this disclosure. Preferably, the CNT 14 is a Multiwalled, or Multiwall, Carbon Nanotube (MWCNT) 14 and will be referred to as such for much of this disclosure. However, in an alternative embodiment, the CNT 14 is a Single Walled CNT. As will be appreciated by one of ordinary skill in the art, the MWCNT 14 includes multiple conduction shells, or conduction layers, of carbon, which is typically in the form of graphite. The multiple conduction shells may be in a spiral pattern such that a cross-section of the MWCNT 14 is a spiral pattern. Alternatively, the multiple conduction shells in the MWCNT 14 may be concentric tubes such that a cross-section of the MWCNT 14 is a set of concentric circles. Each of the interconnects 16 and 18 is formed of an electrically conducting material and may be, for example, a metallic interconnect (e.g., a metal pad or wire), an electrically conducting polymer interconnect, a graphene interconnect, or the like. The substrate 20 may be any type of suitable substrate such as, for example, a semiconductor substrate, a dielectric substrate, or the like.

In this embodiment, a Focused Electron Beam Chemical Vapor Deposition (FEB-CVD) process, which may also be referred to as an Electron Beam Induced Deposition (EBID) process, is used to form the interfaces 10 and 12 between the MWCNT 14 and the interconnects 16 and 18 on the substrate 20. By taking advantage of surface diffusion of precursor molecules and controlling a location of a primary, or high energy, electron beam (e-beam) used in the FEB-CVD process, the interfaces 10 and 12 are fabricated with nanometer resolution such that there are low electric resistance ohmic contacts formed between all conduction shells, or at least a majority of the conduction shells, of the MWCNT 14 and the interconnects 16 and 18 on the substrate 20.

Figure 2:
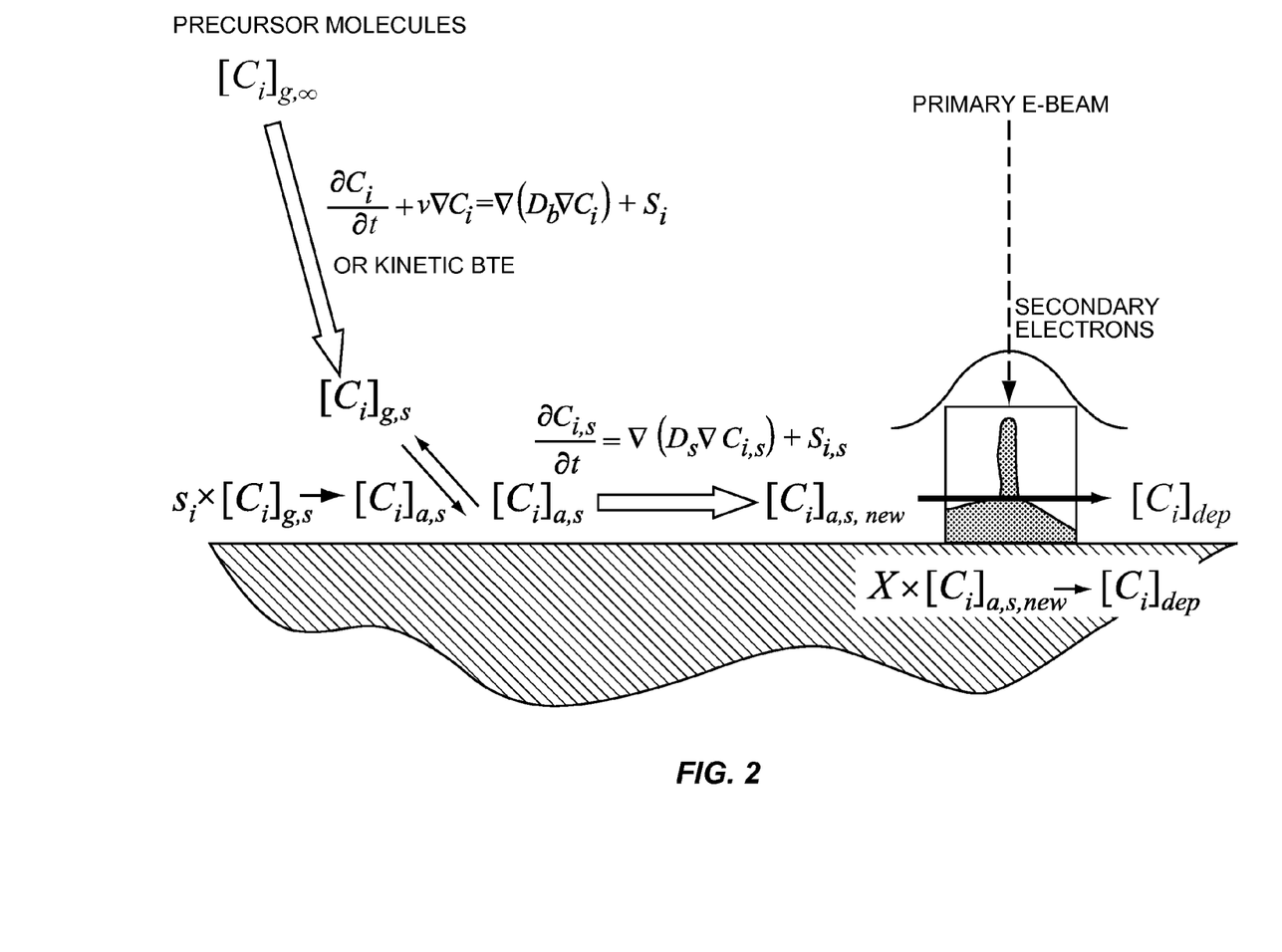
FIG. 2 graphically illustrates a Focused Electron Beam Chemical Vapor Deposition (FEB-CVD) process, which is also referred to as an Electron Beam Induced Deposition (EBID) process, that is preferably utilized to fabricate the interfaces for a MWCNT of FIG. 1 according to one embodiment of the present disclosure.

Before continuing with the discussion of FIGS. 1A through 1C, a discussion of FED-CVD is beneficial. FIG. 2 graphically illustrates an exemplary FEB-CVD process. In this FEB-CVD process, a tightly-focused, high-energy primary e-beam impinges on a substrate. High energy primary electrons from the primary e-beam interact with the substrate to produce low energy secondary electrons. A precursor gas is introduced into a reaction chamber either via flooding from a smaller reaction cell within the reaction chamber with the precursor gas, local injection of the precursor gas using very a fine needle, or as a residual species pre-adsorbed on the substrate which is commonly referred to as a substrate contamination.

Once adsorbed on the substrate surface, precursor molecules from the precursor gas continuously redistribute on the substrate by surface diffusion. Interactions of adsorbed precursor molecules with back-scattered primary and secondary electrons of the appropriate energy result in dissociation of the precursor molecules and formation of a deposit. As will be appreciated by one of ordinary skill in the art, the precursor gas is selected such that the deposit is formed of a desired material. For example, methane may be selected as the precursor gas in an embodiment where the deposit is desired to be carbon. Note that a variety of materials such as carbon, metals, and like may be deposited via FEB-CVD by selection of the appropriate precursor gas, as will be appreciated by one of ordinary skill in the art upon reading this disclosure. Note that the FEB-CVD process is a room temperature process and is therefore compatible with electronics fabrication processes such as Complementary Metal Oxide Semiconductor (CMOS) fabrication processes.

Returning to FIGS. 1A through 1C, FIG. 1A illustrates the fabrication of the interfaces 10 and 12 at an initial point in time ($t_{initial}$) during the fabrication process. As illustrated, the MWCNT 14 is aligned between the interconnects 16 and 18. In this embodiment, the interconnects 16 and 18 are, for example, contact pads or wires formed of an electrically conducting material. The interfaces 10 and 12 are formed at exposed ends 22 and 24, respectively, of the MWCNT 14. The exposed ends 22 and 24 of the MWCNT 14 expose the inner conduction shells of the MWNCT 14. For the interface 10, the primary e-beam used for the FEB-CVD process is focused near the exposed end 22 of the MWCNT 14. Preferably, the primary e-beam is focused approximately 0 nanometers (nm) (i.e., right at the edge of the exposed end 22 of the MWNT 14) to 500 nm from the exposed end 22 of the MWCNT 14. Likewise, for the interface 12, the primary e-beam used for the FEB-CVD process is focused near the exposed end 24 of the MWCNT 14. Preferably, the primary e-beam is focused approximately 0 nm (i.e., right at the edge of the exposed end 24 of the MWNT 14) to 500 nm from the exposed end 24 of the MWCNT 14. By focusing the primary e-beam near the exposed ends 22 and 24 of the MWCNT 14, an interface material is deposited near the exposed ends 22 and 24 of the MWCNT 14 and, in this embodiment, over the interconnects 16 and 18. In one embodiment, the interface material is a-C. In another embodiment, the interface material is a metal such as, for example, Copper, Platinum, Tungsten, or the like. Again, the interface material can be selected by utilizing the appropriate precursor compound.

FIG. 1B illustrates the interfaces 10 and 12 at an intermediate time ($t_{intermediate}$) in the fabrication process. As illustrated, surface diffusion of the precursor molecules has induced lateral spread of the deposited interface material into the MWCNT 14 at the exposed ends 22 and 24 of the MWCNT 14. In one embodiment, timing of an ON/OFF regime, or sequence, for the primary e-beam is controlled such that surface diffusion of the precursor molecules is given sufficient time to induce lateral spread of the deposited interface material into the exposed ends 22 and 24 of the MWCNT 14. As will be appreciated by one of ordinary skill in the art upon reading this disclosure, the amount of time that is sufficient to induce lateral spread of the deposited interface material into the exposed ends 22 and 24 may vary depending on various parameters such as, but not limited to, a surface diffusion coefficient for the precursor molecules on the surface of the substrate 20, the physico-chemical nature of the precursor molecule and the substrate 20, the deposition conditions (pressure, temperature), among other factors and a distance between the primary e-beam and the exposed ends 22 and 24 of the MWCNT 14.

FIG. 1C illustrates the interfaces 10 and 12 at a final time ($t_{final}$) in the fabrication process. At this point, deposition of the interface material is complete. As illustrated, surface diffusion of the precursor molecules has continued to induce lateral spread of the deposited interface material into the MWCNT 14 such that the deposited interface material atomically fills and establishes an electric contact to all conduction shells (both inner and outer), or at least a majority of the conduction shells, of the MWCNT 14 at the exposed ends 22 and 24 of the MWCNT 14. Again, in one embodiment, timing of an ON/OFF regime, or sequence, for the primary e-beam is controlled such that surface diffusion of the precursor molecules is given sufficient time to induce lateral spread of the deposited interface material into the exposed ends 22 and 24 of the MWCNT 14.

In one embodiment, fabrication of the interfaces 10 and 12 is completed via post processing. More specifically, the interfaces 10 and 12 may be annealed by either direct heating (thermal) or by passing an electric current through the interface (electric). For example, in one embodiment, the deposited interface material is a-C, which, due to its amorphous structure, is an insulator rather than a conductor. By thermally or electrically annealing the deposited interface material, the a-C is partially or totally graphitized. In other words, via thermal or electric annealing, the deposited carbon transitions from a-C, which is insulating, to partially or totally graphitized carbon, which is conducting. As a result, after post processing, the interfaces 10 and 12 are ohmic contacts having low electric resistivity. Note that in the embodiment where the deposited interface material is a-C, after post processing, the electric resistivity of the interfaces 10 and 12 is low both because of the conductivity of the partially or totally graphitized carbon interfaces 10 and 12 and because the partially or totally graphitized carbon interfaces 10 and 12 have a crystalline structure that is the same as, or similar to, that of the conduction shells of the MWCNT 14.

Figure 3:
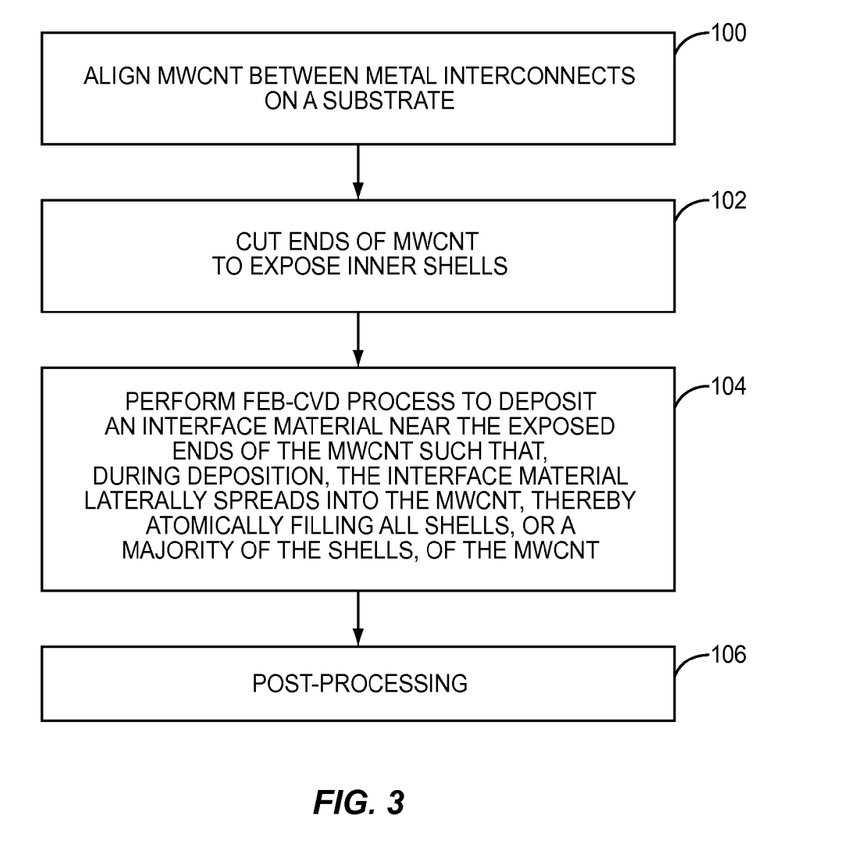
FIG. 3 is a flow chart illustrating a process for fabricating an interface for a MWCNT according to one embodiment of the present disclosure.

FIG. 3 is a flow chart illustrating a process for fabricating the interfaces 10 and 12 between the MWCNT 14 and the interconnects 16 and 18 on the substrate 20 according to one embodiment of this disclosure. First, the MWCNT 14 is aligned between the interconnects 16 and 18 (step 100). The MWCNT 14 may be aligned between the interconnects 16 and 18 using any suitable technique. In one embodiment, a droplet of MWCNT solution is placed on a region of the substrate 20 containing the interconnects 16 and 18. A Direct Current (DC), Alternating Current (AC), or DC-AC potential is then applied on one of the interconnects 16 and 18, the other one of the interconnects 16 and 18 is allowed to remain floating, and a third interconnect (not shown) in the region is grounded. A strength of the resulting non-uniform interelectrode electric field is controlled to overcome Brownian motion such that the MWCNT 14, which is within the MWCNT solution, aligns between the interconnects 16 and 18. While not essential, for a more detailed discussion of an exemplary process for aligning the MWCNT 14 between the interconnects 16 and 18, the interested reader is directed to J. W. Song et al., "Characterization and air pressure sensing of doubly clamped multi-walled carbon nanotubes," 19 Nanotechnology 4 (2008), which is hereby incorporated herein by reference for its teaching relating to aligning a MWCNT between electrodes.

Next, the ends of the MWCNT 14 are cut to expose the inner conductive shells of the MWCNT 14, thereby providing the exposed ends 22 and 24 of the MWCNT 14 (step 102). Note that some MWCNTs may already have exposed ends and therefore do not need to be cut. As such, step 102 may not be needed for all types of MWCNTs. Any suitable process for cutting the ends of the MWCNT 14, or otherwise opening the ends of the MWCNT 14 to expose the inner conduction shells, may be used. In one embodiment, localized water assisted electron beam etching and Focused Ion Beam (FIB) cutting is used to cut the ends of the MWCNT 14 to expose the inner conduction shells. More specifically, if small amounts of water vapor are introduced into the microscope chamber, the MWCNT 14 may be cut by focusing the primary e-beam at the desired location to perform an etching process. The carbon forming the MWCNT 14 may be etched as a result of the reaction $C+2H_2O \rightarrow CO_2+2H_2$ with $\Delta H = -82.4$ kilojoules per mole (kJ/mol). Carbon can also be removed from the MWCNT 14 by exothermic reactions $C+O_2 \rightarrow CO_2$ and $C+1/2 H_2 \rightarrow CH$ with oxygen and hydrogen originating either from the environment or the water reaction.

A FEB-CVD process is then performed to deposit a desired interface material near the exposed ends 22 and 24 of the MWCNT 14 such that, during deposition, the interface material laterally spreads into the MWCNT 14, thereby atomically filling and making contact to all conduction shells (both inner and outer), or at least a majority of the conduction shells, of the MWCNT 14 at the exposed ends 22 and 24 of the MWCNT 14 (step 104). As discussed above, the primary e-beam used for the FEB-CVD process is focused near the exposed end 22 of the MWCNT 14. During deposition of the desired interface material, surface diffusion of the precursor molecules induces lateral spread of the interface material into the MWCNT 14 such that the interface 10 connects to all conduction shells, or at least most conduction shells, of the MWCNT 14. Likewise, the primary e-beam used for the FEB-CVD process is focused near the exposed end 24 of the MWCNT 14. During deposition of the desired interface material, surface diffusion of the precursor molecules induces lateral spread of the interface material into the MWCNT 14 such that the interface 12 connects to all conduction shells, or at least most conduction shells, of the MWCNT 14.

Note that various parameters of the FEB-CVD process may be adjusted to control a size and shape of the interfaces 10 and 12 to an arbitrary degree as well as to control the growth rate of the interfaces 10 and 12. For instance, primary e-beam current, primary e-beam energy, primary e-beam diameter, deposition chamber pressure and temperature, deposition time, precursor delivery scheme, or any combination thereof may be controlled to grow the interfaces 10 and 12 in a desired shape and size at an acceptable growth rate. As an example, the interfaces 10 and 12 may be grown using a Scanning Electron Microscope (SEM) as the source of the primary e-beam in a high vacuum of 10-6 Torr with no additional precursor gases introduced by keeping the primary e-beam focused for a time period between 2.5 minutes and 25 minutes with a e-beam accelerating voltage or energy in the range of 15-30 kiloelectron volts (keV) and with a primary e-beam current in the range of approximately 350-450 picoamps (pA). While not essential, for more information regarding the effects of the FEB-CVD process parameters on the size and shape of the interfaces 10 and 12 and the growth rate of the interfaces 10 and 12, the interested reader is directed to Andrei G. Fedorov et al., "Transport issues in focused electron beam chemical vapor deposition," 201 Surface & Coatings Technology 8808 (2007), Konrad Rykaczewski et al., "Analysis of electron beam induced deposition (EBID) of residual hydrocarbons in electron microscopy," 101 Journal of Applied Physics 054307 (2007), Konrad Rykaczewski et al. "Dynamic growth of carbon nanopillars and microrings in electron beam induced dissociation of residual hydrocarbons," 108 Ultramicroscopy 989 (2008), and William B. White et al., "What Controls Deposition Rate in Electron-Beam Chemical Vapor Deposition?," 97 Physical Review Letters 086101 (2006), each of which is incorporated herein by reference for their teachings on the effect of FEB-CVD parameters on the size and shape of the deposit and the growth rate of the deposit.

Once the interfaces 10 and 12 are deposited, post-processing may be performed (step 106). Note that post-processing may not be needed for all types of interface materials. In one embodiment, the deposited interface material is a-C. For a-C, thermal or electric annealing is used to provide total or partial graphitization of the a-C thereby causing the interfaces 10 and 12 to transition from insulating to conducting. At this point, the carbon interfaces 10 and 12 have a low-electric resistance as a result of the post-processing and the fact that the crystalline structure of the carbon interfaces 10 and 12 is the same as, or similar to, that of the conduction shells of the MWCNT 14. Once post-processing is complete, the interfaces 10 and 12 provide low electric resistance ohmic contacts to all of the conduction shells, or at least a majority of the conduction shells, of the MWCNT 14.

Figure 4A:
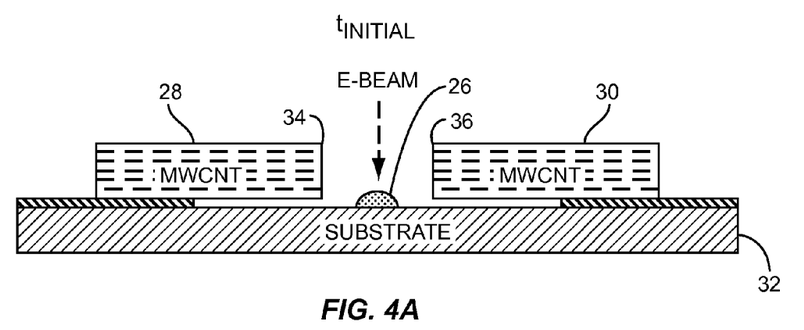
FIGS. 4A through 4C graphically illustrate fabrication of an interface between MWCNTs according to another embodiment of the present disclosure.
Figure 4B:
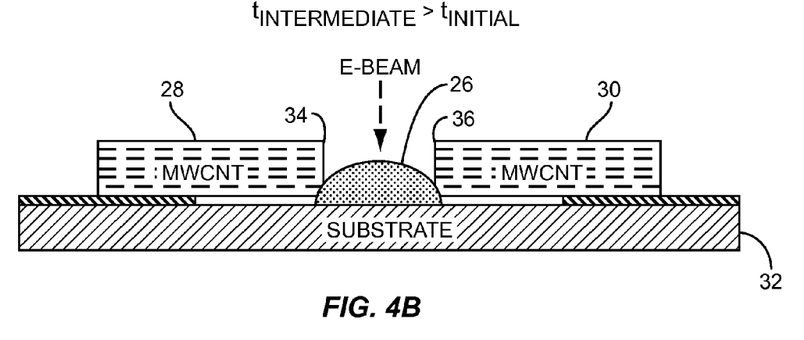
Figure 4C:
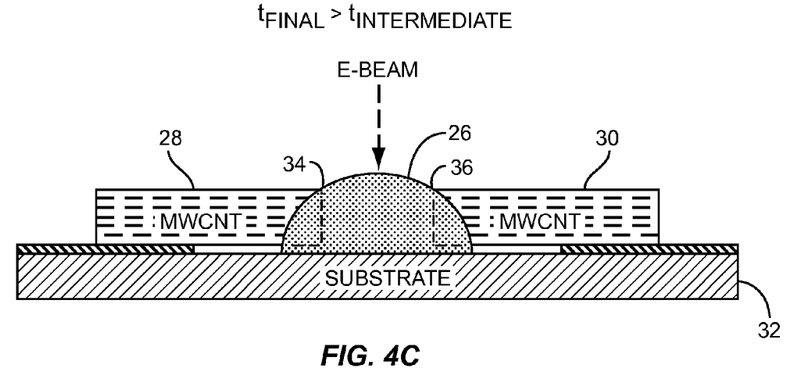

FIGS. 4A through 4C graphically illustrate a process for fabricating an interface 26 between CNTs 28 and 30 on a substrate 32 according to another embodiment of the present disclosure. Preferably, the CNTs 28 and 30 are MWCNTs 28 and 30 and, therefore, will be referred to as such for much of this disclosure. However, in an alternative embodiment, the CNTs 28 and 30 are Single Walled CNTs. Note that while FIGS. 4A through 4C illustrate two MWCNTs 28 and 30, this process may be used to create an interface between more than two MWCNTs such that the interface 26 connects aligned ends of the more than two MWCNTs. For example, one end of each of three MWCNTs may be aligned such that the interface 26 connects the aligned ends of the three MWCNTs.

The process of FIGS. 4A through 4C is substantially the same as that described above. FIG. 4A illustrates the fabrication of the interface 26 at an initial point in time ($t_{initial}$). As illustrated, an end 34 of MWCNT 28 has been aligned with an end 36 of the MWCNT 30 using any suitable technique. Depending on whether the ends 34 and 36 of the MWCNTs 28 and 30, respectively, are already exposed, the ends 34 and 36 may be cut using, for example, an FIB cutting process to expose the inner shells of the MWCNTs 28 and 30, which are hereinafter referred to as exposed ends 34 and 36. A primary e-beam used for the FED-CVD process is focused near the exposed ends 34 and 36 of the MWCNTs 28 and 30. Preferably, the primary e-beam is focused in the range of and including approximately 0 nm (i.e., right at the edge of the exposed end of the MWNT) to 500 nm from each of the exposed ends 34 and 36 of the MWCNTs 28 and 30. By focusing the primary e-beam near the exposed ends 34 and 36 of the MWCNTs 28 and 30, an interface material is deposited near the exposed ends 34 and 36 of the MWCNTs 28 and 30. In one embodiment, the interface material is a-C. In another embodiment, the interface material is a metal such as, for example, Copper, Platinum, Tungsten, or the others. Again, the interface material can be selected by utilizing the appropriate precursor compound.

FIG. 4B illustrates the interface 26 at an intermediate time ($t_{intermediate}$) in the fabrication process. As illustrated, surface diffusion of the precursor molecules has induced lateral spread of the deposited interface material into the exposed ends 34 and 36 of the MWCNTs 28 and 30. In one embodiment, timing of an ON/OFF regime, or sequence, for the primary e-beam is controlled such that surface diffusion of the precursor molecules is given sufficient time to induce lateral spread of the deposited interface material into the exposed ends 34 and 36 of the MWCNTs 28 and 30. As will be appreciated by one of ordinary skill in the art upon reading this disclosure, the amount of time that is sufficient to induce lateral spread of the deposited interface material into the exposed ends 34 and 36 of the MWCNTs 28 and 30 may vary depending on various parameters such as, but not limited to, a surface diffusion coefficient for the precursor molecules on the surface of the substrate 32, the physico-chemical nature of the precursor molecule and the substrate 32, the deposition conditions (pressure, temperature), among other factors and a distance between the primary e-beam and the exposed ends 34 and 36 of the MWCNTs 28 and 30.

FIG. 4C illustrates the interface 26 at a final time ($t_{final}$) in the fabrication process. At this point, deposition of the interface material is complete. As illustrated, surface diffusion of the precursor molecules has continued to induce lateral spread of the deposited interface material into the exposed ends 34 and 36 of the MWCNTs 28 and 30 such that the deposited interface material atomically fills and establishes an electric contact to all conduction shells (both inner and outer), or at least a majority of the conduction shells, of the MWCNTs 28 and 30 at the exposed ends 34 and 36 of the MWCNTs 28 and 30. Again, in one embodiment, timing of an ON/OFF regime, or sequence, for the primary e-beam is controlled such that surface diffusion of the precursor molecules is given sufficient time to induce lateral spread of the deposited interface material into the exposed ends 34 and 36 of the MWCNTs 28 and 30.

In one embodiment, fabrication of the interface 26 is completed via post processing. More specifically, the interface 26 may be annealed by either direct heating (thermal) or by passing an electric current through the interface (electric). For example, in one embodiment, the deposited interface material is a-C, which, due to its amorphous structure, is an insulator rather than a conductor. By thermally or electrically annealing the deposited interface material, the a-C is partially or totally graphitized. In other words, via thermal or electric annealing, the deposited carbon transitions from a-C, which is insulating, to partially or totally graphitized carbon, which is conducting. As a result, after post processing, the interface 26 is an ohmic contact having low electric resistivity. Note that in the embodiment where the deposited interface material is a-C, after post processing, the electric resistivity of the interface 26 is low both because of the conductivity of the partially or totally graphitized carbon interface 26 and because the partially or totally graphitized carbon interface 26 has a crystalline structure that is the same as, or similar to, that of the conduction shells of the MWCNTs 28 and 30.

Figure 5:
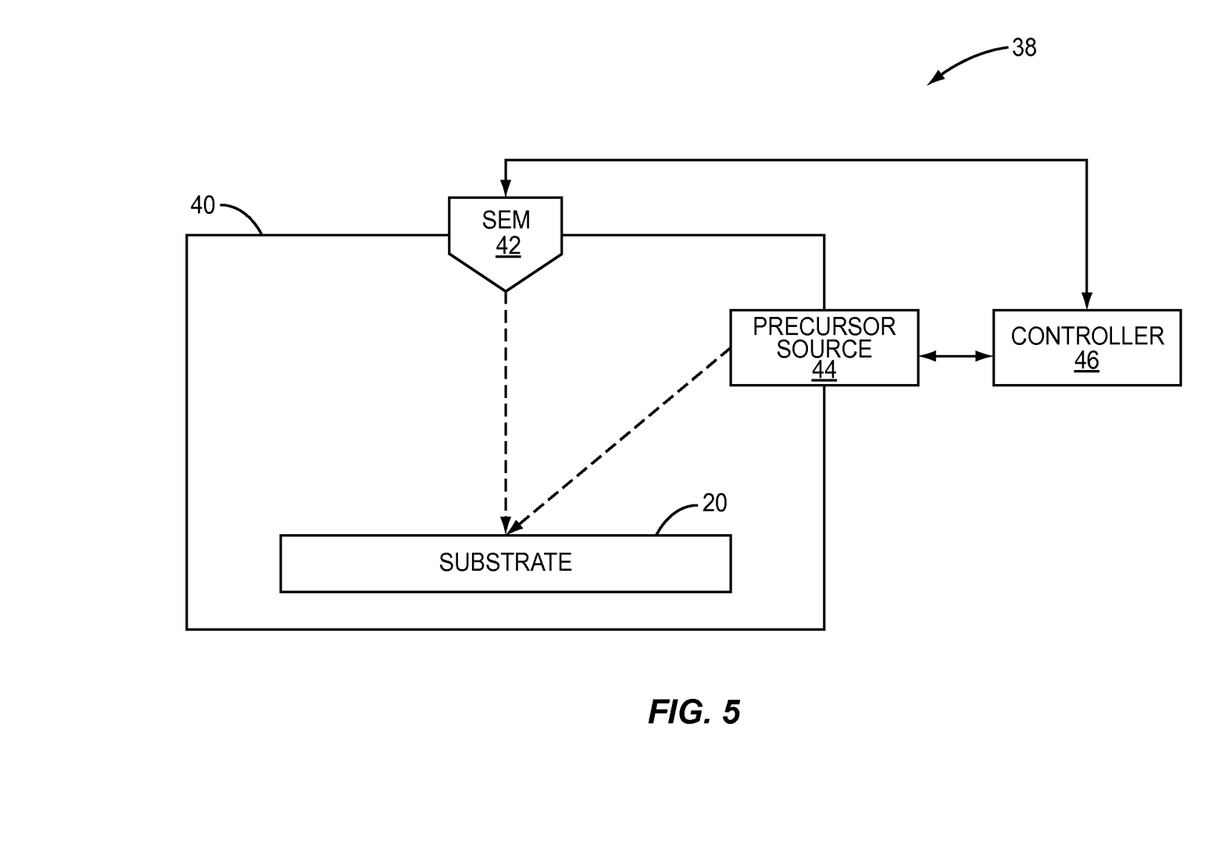
FIG. 5 illustrates a FEB-CVD system for fabricating an interface for a MWCNT on a substrate according to one embodiment of the present disclosure.

FIG. 5 illustrates a system 38 for fabricating the interfaces 10 and 12 between the MWCNT 14 and the interconnects 16 and 18 on the substrate 20 according to one embodiment of the present disclosure. Note that this discussion is equally applicable to the fabrication of the interface 26 between the MWCNTs 28 and 30 as described above in FIGS. 4A through 4C. As illustrated, the substrate 20 is located within a reaction chamber 40. A primary e-beam source, which in this embodiment is a Scanning Electron Microscope (SEM) 42, provides the primary e-beam for the FEB-CVD process. The system 38 may also include a precursor source 44. The precursor source 44 may operate to flood the reaction chamber 40 with the precursor gas or provide the precursor gas to a localized region of the substrate 20 via an associated needle. Note that the precursor source 44 is optional. In another embodiment, the precursor gas is pre-adsorbed on the surface of the substrate 20 from the contamination or exposure to environment. Lastly, the system 38 includes a controller 46. The controller 34 is a hardware device such as, for example, a personal computer. The controller 46 includes one or more hardware components, one or more software components, or a combination thereof that enable the controller 46 to control the SEM 42 and optionally the precursor source 44 and substrate 20 to fabricate the interfaces 10 and 12 as described above. Note that the system 38 may include additional components that are not illustrated in FIG. 5, as will be appreciated by one of ordinary skill in the art upon reading this disclosure. For example, the system 38 may include a vacuum pump that operates to control the pressure within the reaction chamber 40.

Those skilled in the art will recognize improvements and modifications to the embodiments of the present invention. All such improvements and modifications are considered within the scope of the concepts disclosed herein and the claims that follow.

What is claimed is:

1. A Focused Electron Beam Chemical Vapor Deposition (FEB-CVD) system comprising:
   a primary electron beam source; and
   a controller associated with the primary electron beam source and adapted to control the primary electron beam source to fabricate an interface between an exposed end of a multiwalled carbon nanotube (MWCNT) and a desired node on a substrate such that the interface forms a contact with at least a majority of a plurality of conduction shells of the MWCNT at the exposed end of the MWCNT.

2. The FEB-CVD system of claim 1 wherein the interface forms a contact with all of the plurality of conduction shells of the MWCNT.

3. The FEB-CVD system of claim 1 wherein the controller is further adapted to control the primary electron beam source to focus a primary electron beam generated by the primary electron beam source near the exposed end of the MWCNT such that, during deposition of a desired interface material for the interface, surface diffusion of precursor molecules used by the FEB-CVD system induces spread of the desired interface material into the exposed end of the MWCNT.

4. The FEB-CVD system of claim 3 wherein the primary electron beam is focused at a location that is less than or equal to 500 nanometers (nm) from the exposed end of the MWCNT.

5. The FEB-CVD system of claim 3 wherein the controller is further adapted to control the primary electron beam source to control an ON/OFF timing of the primary electron beam during deposition of the desired interface material such that surface diffusion of the precursor molecules is provided sufficient time to induce spread of the desired interface material into the exposed end of the MWCNT.

6. The FEB-CVD system of claim 3 wherein the desired interface material is amorphous Carbon (a-C).

7. The FEB-CVD system of claim 6 wherein post-processing is utilized to provide at least partial graphitization of the a-C such that the interface transitions from insulating to conducting.

8. The FEB-CVD system of claim 3 wherein the desired interface material is a metallic material.

9. The FEB-CVD system of claim 1 wherein the interface is fabricated at room temperature.

10. The FEB-CVD system of claim 1 wherein the MWCNT initially has a closed end, and the MWCNT is processed to open the closed end of the MWCNT to provide the exposed end of the MWCNT.

11. The FEB-CVD system of claim 1 wherein the interface is a low electric resistance ohmic contact between the at least a majority of the plurality of conduction shells of the MWCNT and the desired node on the substrate.

12. The FEB-CVD system of claim 1 wherein the desired node is an electrically conducting interconnect.

13. The FEB-CVD system of claim 1 wherein the desired node is an exposed end of a second MWCNT such that the interface connects at least a majority of the plurality of conduction shells of the MWCNT at the exposed end of the MWCNT and at least a majority of a plurality of conduction shells of the second MWCNT at the exposed end of the second MWCNT.

14. An integrated circuit comprising:
    a substrate;
    a multiwalled carbon nanotube (MWCNT) comprising a plurality of conduction shells; and
    an interface interconnecting at least a majority of the plurality of conduction shells at an exposed end of the MWCNT and a desired node on the substrate, wherein the interface is fabricated near the exposed end of the MWCNT using a Focused Electron Beam Chemical Vapor Deposition (FEB-CVD) process such that, during deposition of a desired interface material for the interface, surface diffusion induces spreading of the desired interface material into the exposed end of the MWCNT.

15. The integrated circuit of claim 14 wherein the desired node is an electrically conducting interconnect.

16. The integrated circuit of claim 14 wherein the desired node is an exposed end of a second MWCNT such that the interface connects at least a majority of the plurality of conduction shells of the MWCNT at the exposed end of the MWCNT and at least a majority of a plurality of conduction shells of the second MWCNT at the exposed end of the second MWCNT.

* * * * *